United States Patent [19]
Reinberg

[11] Patent Number: 5,847,439
[45] Date of Patent: Dec. 8, 1998

[54] INTEGRATED CIRCUIT HAVING A VOID BETWEEN ADJACENT CONDUCTIVE LINES

[75] Inventor: Alan R. Reinberg, Boise, Id.

[73] Assignee: Micron Technology, Inc., Boise, Id.

[21] Appl. No.: 676,537

[22] Filed: Jul. 9, 1996

Related U.S. Application Data

[63] Continuation of Ser. No. 481,051, Jun. 7, 1995, Pat. No. 5,599,745.

[51] Int. Cl.⁶ .............................. H01L 29/00; H01L 23/58
[52] U.S. Cl. ........................... 257/522; 257/634; 257/644
[58] Field of Search ................... 257/410, 522, 257/634, 644

[56] References Cited

U.S. PATENT DOCUMENTS

| | | |
|---|---|---|
| 4,106,050 | 8/1978 | Riseman . |
| 4,323,914 | 4/1982 | Berndlmaier et al. . |
| 4,987,101 | 1/1991 | Kaanta et al. ........................... 437/228 |
| 5,001,079 | 3/1991 | Van Laarhoven et al. ............... 437/50 |
| 5,338,975 | 8/1994 | Cole, Jr. et al. ........................ 257/750 |
| 5,512,775 | 4/1996 | Cho ........................................ 257/522 |
| 5,534,731 | 7/1996 | Chenng ................................... 257/759 |

*Primary Examiner*—Ngân V. Ngô
*Attorney, Agent, or Firm*—Fletcher, Yoder & Edwards

[57] ABSTRACT

The invention proposes methods for producing integrated circuits wherein the dielectric constant between closely spaced and adjacent metal lines is approaching 1. One method of the invention uses low-melting-point dielectric to form a barrier form a void between conductive lines. Another method of the invention uses sidewall film to form a similar barrier.

23 Claims, 4 Drawing Sheets

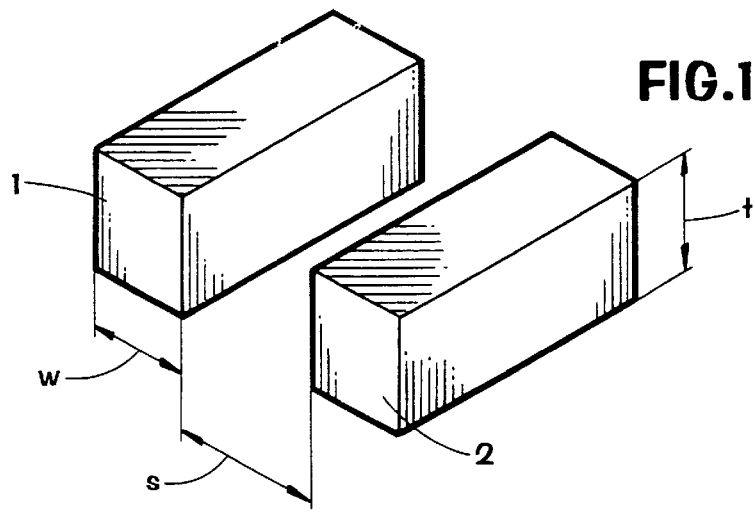
FIG.1
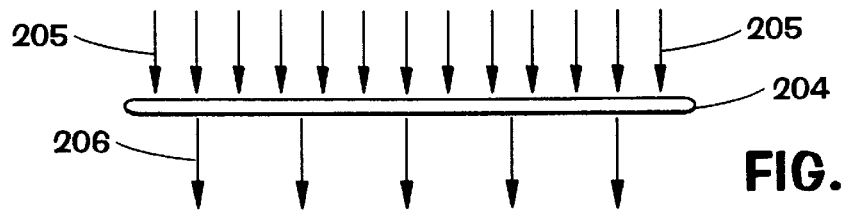
FIG.2
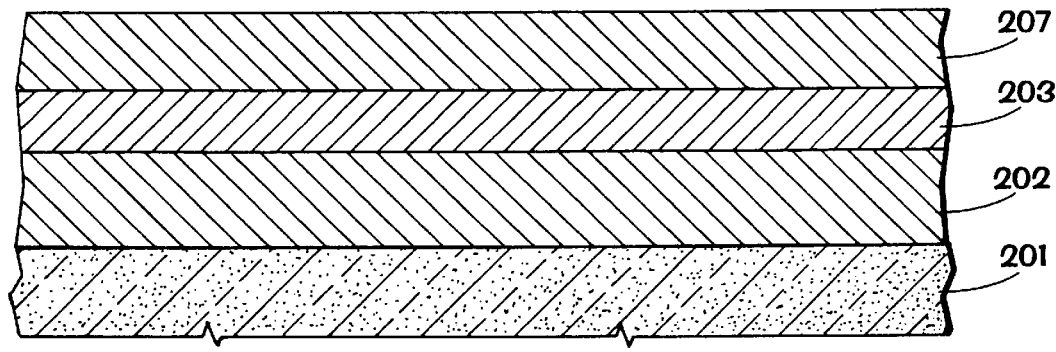
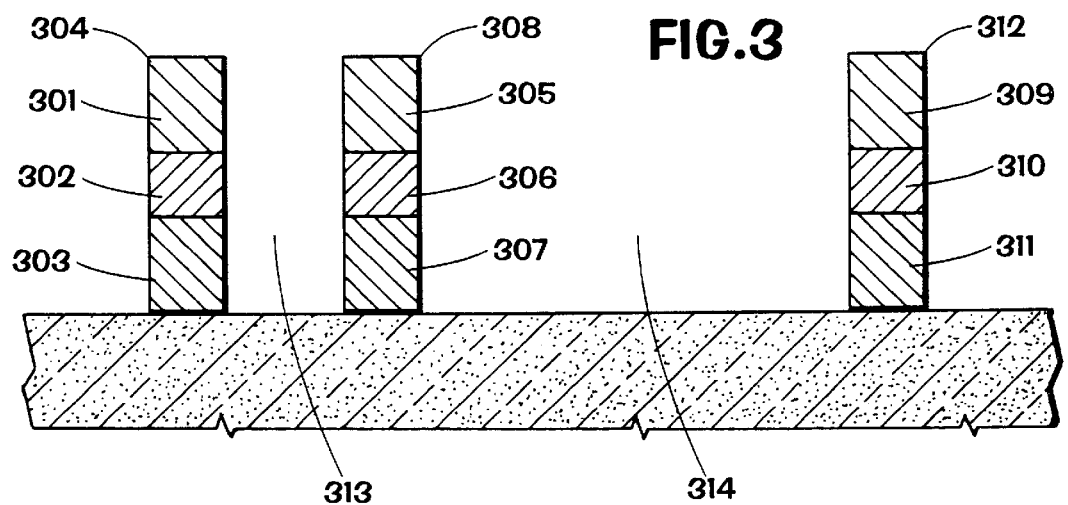
FIG.3

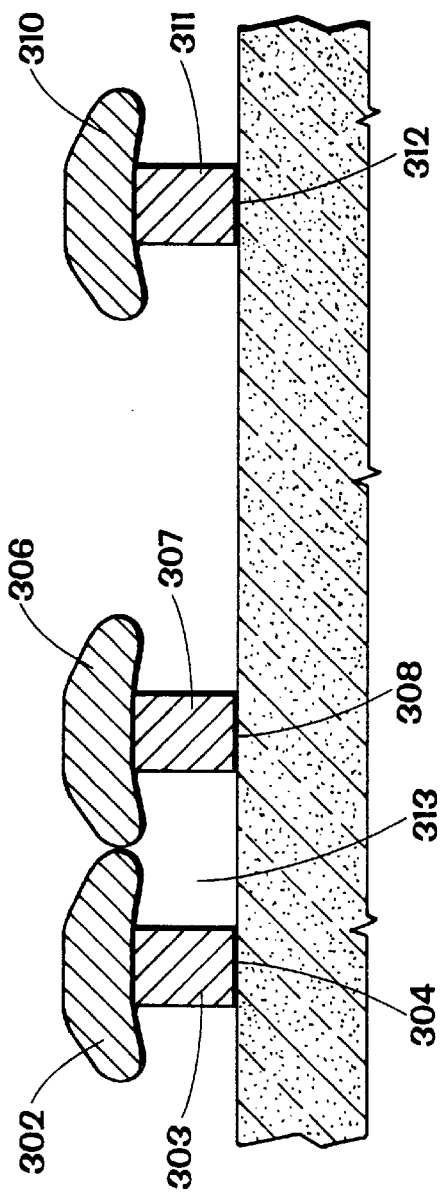
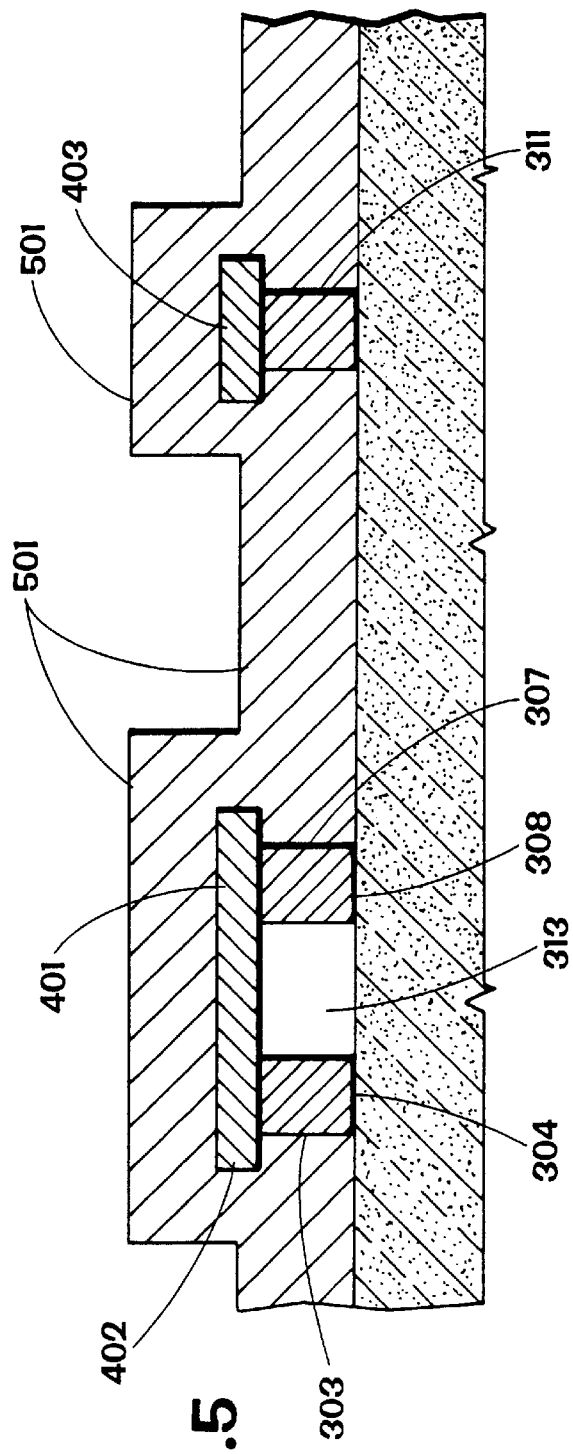

5,847,439

INTEGRATED CIRCUIT HAVING A VOID BETWEEN ADJACENT CONDUCTIVE LINES

This application is a continuation of application Ser. No. 08/481,051, filed Jun. 7, 1995 now U.S. Pat. No. 5,599,745.

BACKGROUND OF THE INVENTION

1. Field of the Invention

The present invention relates to a method and apparatus for providing an improved dielectric property between adjacent conductive lines in a semiconductor device. More particularly, the present invention relates to a method and apparatus where the space between closely proximate conductive lines comprises an air void, e.g. a space not filled by either: (i) the dielectric material usually needed for insulation between layers of conductive lines; or 2) the passivation overcoat formed on the top layer of conductive lines. As a result, the invention provides for minimum capacitive coupling because the space between closely positioned conductive lines is free space having a unitary dielectric constant.

2. Description of the Related Art

The integrated circuit industry is constantly reducing the separation between conductive lines to achieve a smaller integrated circuit. Minimizing integrated circuit area is important because it yields many benefits including higher reliability, lower cost, and higher speed.

Reducing the spacing between the conductive lines in an integrated circuit, however, results in an increase in the amount of capacitive crosstalk between these conductive lines. In conventional integrated circuits, the interconnect arrangement typically consists of many adjacent conductive lines. If the capacitive crosstalk between a first conductive line and a second conductive line is high, then the voltage on the first conductive line alters or affects the voltage on the second line. This alteration in voltage could cause an integrated circuit to misinterpret logic levels and/or voltage levels and, therefore, incorrectly process binary and/or analog information. An integrated circuit that incorrectly processes any information is usually considered inoperable or faulty.

Illustrated in FIG. 1 is a semiconductor structure having two conductive lines. FIG. 1 depicts a conductive line 1 and a conductive line 2 adjacent to conductive line 1. Each of conductive lines 1 and 2 has a width "w," and conductive line 1 is separated from conductive line 2 by a separation distance "s." A quantity known as a pitch (pitch=w+s) is conventionally used to characterize capacitive crosstalk for adjacent conductive lines used in the integrated circuit industry.

As noted above, a reduction of pitch is an ongoing activity in the integrated circuit industry to achieve integrated circuits which are more dense and use substrate surface area more efficiently. The capacitance between conductive lines 1 and 2 has been found to increase exponentially as pitch is reduced or as the conductive lines 1 and 2 are brought closer together.

This increase in capacitive coupling between conductive lines 1 and 2 is a disadvantage because of the resulting increase in the amount of capacitive crosstalk between the conductive lines. For instance, if conductive line 1 is separated from conductive line 2 by one hundred microns, the coupling capacitance will be small and there will be virtually no capacitive crosstalk between the conductive lines. If the pitch is less than approximately one micron, however, the capacitive coupling between the conductive lines will be high. Consequently, the amount of capacitive crosstalk will be high and may render the particular integrated circuit inoperable.

Capacitive crosstalk is a phenomenon wherein a voltage level at conductive line 1 adversely effects and/or alters the voltage level at conductive line 2 through the capacitive coupling between conductive lines 1 and 2. Assume that the pitch in a conductive layer of a DRAM is 2 microns and that the DRAM has a plurality of data lines and address lines. These address and data lines are typically run across the integrated circuit together or in groups. The conductive lines making up these data lines and address lines are separated by a minimum pitch to conserve surface area on the integrated circuit. One data or address line may be carrying a logic one (i.e., a five volt signal). An adjacent data or address line may be carrying a logic zero (i.e., a zero volt signal or ground potential).

The capacitive crosstalk due to this small pitch may cause the logic one value on the first line to effect and/or alter the logic zero value on the adjacent line and/or vice versa. Therefore, instead of properly carrying the correct logic one voltage level or logic zero voltage level, the address and data lines may carry an erroneous voltage level. This erroneous voltage level could alter the operation of the DRAM rendering it faulty or inoperable. Crosstalk phenomenon may have an even greater effect on the operation of analog circuitry.

One prior art method for reducing capacitive coupling, and therefore for reducing capacitive crosstalk between conductive lines having a small pitch, is the use of low dielectric constant materials to replace the conventional dielectric materials which are typically used for insulation between conductive layers and the passivation overcoat layer formed on the top conductive layer. Conventional semiconductor dielectric materials have a dielectric constant of about four. Some new dielectric materials, such as Teflon may have a dielectric constant between about two and four. The use of many dielectric materials having low dielectric constants, however, is not feasible because the equipment necessary to process properly the new dielectric materials in integrated circuits is not available. Also, the chemical or physical properties of many of these dielectric materials may be difficult to integrate into conventional integrated circuit processing.

Another prior art method for reducing capacitive crosstalk between conductive lines having a small pitch is the use of coaxial cable type arrangements in integrated circuits. A coaxial arrangement typically consists of a first conductor which carries a signal and a second conductor surrounding the first conductor which is used to shield the first conductor from other conductors in the integrated circuit. This coaxial arrangement is very difficult to form in a integrated circuit since one conductor must be entirely surrounded by a second conductor. Furthermore, this coaxial arrangement requires two or more conductive layers. Thus, one functional layer of conductive interconnect requires several layers of conductive material. The use of several conductive layers to form one functional conductive interconnect layer is simply not a cost effective method for reducing capacitive crosstalk between conducive lines with a small pitch.

Another prior art method for reducing capacitive crosstalk between conductive lines having a small pitch proposes a partial air gap in the dielectric region between these conductive lines. In this method, a plug is formed between adjacent conductive lines to provide a partial air gap between these conductive lines when the interlevel insulation or passivation overcoat is formed on top of this plug. This method, however, does not provide a material free region between these conductive lines (i.e. 100% air gap) and will not achieve a dielectric constant approaching 1. Furthermore, this method entails the use of many additional complex and costly processing steps to form the plug and thus is not a simple and cost effective method for reducing capacitive crosstalk.

For example, if a dielectric layer having a dielectric constant of 4.3 is used as an interlevel dielectric, then, if there is no air gap (percentage of air gap=0%), the entire region between the conductive lines depends solely upon the dielectric constant of the dielectric material used; 4.3 in this example. If a 50% air gap is formed between conductors, i.e. only 50% of the region between the conductive lines is dielectric material, the effective dielectric constant of the region between the conductive regions is reduced to K=2.75 and, thus, the capacitance is reduced. The dielectric value K=2.75 is 50% due to air and 50% due to the remaining dielectric regions. Ideally, a material free region (100% air gap) is desired wherein the capacitance is very low and the dielectric constant is reduced significantly.

Yet another prior art method for reducing capacitive crosstalk between conductive lines with a small pitch proposes a material free region (100% air gap) between these conductive lines. In this method three layers including a growth or seed layer in the middle must be formed on top of the conductive lines. Then the sidewall of the growth or seed layer is selectively grown to close off the opening between the conductive lines to form the material free region. This method also entails the use of many additional, complex, and costly processing steps and, therefore, is not a simple and cost effective method for reducing capacitive crosstalk.

Thus, to maintain a small pitch between conductive lines on an integrated circuit and therefore achieve a denser, lower costing integrated circuit, a new, simpler and more cost effective method for reducing coupling capacitance, and therefore reducing capacitive crosstalk between these conductive lines, is needed.

SUMMARY OF THE INVENTION

The invention overcomes the disadvantages and difficulties of the prior art by introducing new methods and devices wherein the area between closely spaced conductors exhibits a dielectric constant approaching 1. To that end, the present invention proposes several methods for leaving a void between closely spaced conductors (usually metal lines) in a semiconductor device. In conjunction with these methods, the invention also proposes a semiconductor device wherein there is a void between closely spaced conductors (metal lines).

One method of the current invention calls for creating a barrier above closely spaced conductors (typically metal lines) by using a low-melting-point glass or organic material. More specifically, after depositing the conductors, this method calls for depositing a layer of low-melting-point glass or organic material. Both the glass and the conductor are then etched using a mask and photoresist process. Furthermore, after removal of the photoresist, the wafer is subjected to a heat cycle. The heat cycle is properly adjusted to cause the glass to sag laterally. Where conductors are closely spaced, the sagging glass from adjacent lines will touch or otherwise form a barrier to subsequently applied layers. The result is a semiconductor product wherein a void exists between the closely spaced conductors.

Another method of the current invention creates a barrier between closely spaced conductors by using sidewall film. In this method, a conductive layer is deposited and then etched using a mask and photoresist process. The wafer is then subjected to a heat cycle before the photoresist is removed. The heat cycle is properly adjusted to cause the photoresist to sag laterally. Where conductors are closely spaced, the sagging photoresist from adjacent lines with touch or near-touch. The sagging photo resist carries the sidewall film on its formerly vertical edge. Therefore, being carried by the sagging photoresist, the sidewall film from closely spaced conductors will arc together or near together forming a barrier to subsequently applied layers. The photoresist is then removed leaving the barrier formed by the sidewall film. The result is a semiconductor product wherein a void exists between the closely spaced conductors.

BRIEF DESCRIPTION OF THE DRAWINGS

The foregoing and other advantages of the invention will become apparent upon reading the following detailed description and upon reference to the drawings in which:

FIG. 1 illustrates two conductive lines for the purpose of defining the width, separation distance, and pitch of adjacent conductors.

FIG. 2 illustrates a layered wafer section.

FIG. 3 illustrates three conductive lines bearing low-melting-point dielectric and photoresist.

FIG. 4 illustrates three conductive lines bearing low-melting-point dielectric.

FIG. 5 illustrates a finished circuit having a void between closely spaced conductor lines.

DETAILED DESCRIPTION OF PREFERRED EMBODIMENTS

Figure 6:
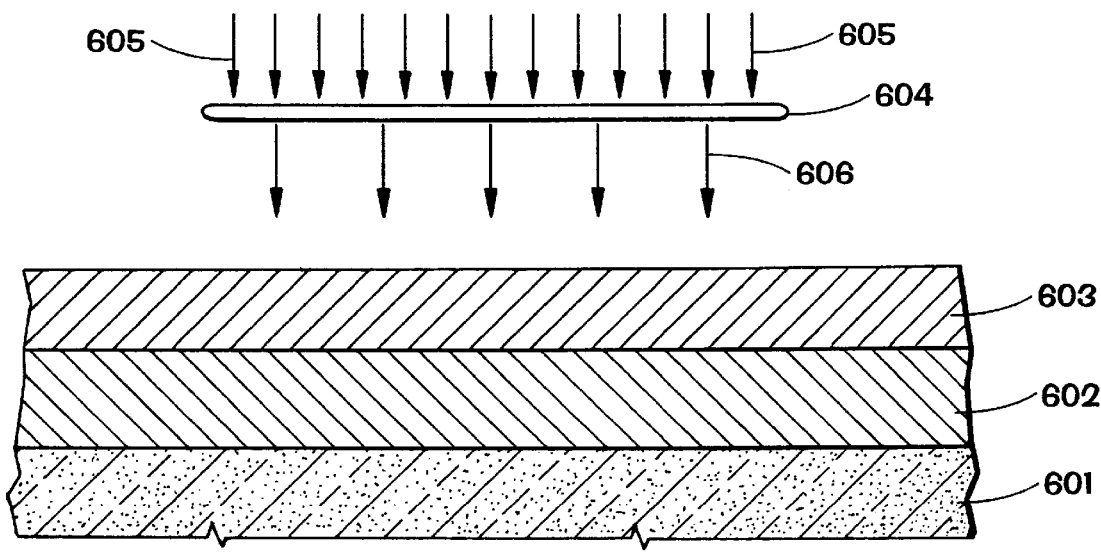
FIG. 6 illustrates a layered wafer section.

The following describes new methods and devices wherein the area between closely spaced conductors exhibits a dielectric constant approaching 1. This desirable dielectric constant is achieved through various methods for leaving a void between closely spaced metal lines in a semiconductor device. In addition to these various methods, the products that result from these various methods will also be described.

Referring to FIG. 2, area 201 represents all layers of a processed silicon wafer disposed prior to metal level 202. The term "metal level" as used herein refers to a conductive level of a semiconductor die, as is usually formed of tungsten, aluminum, or other conventionally-known materials. Metal level 202 is disposed on the wafer by any conventional technique, such as, for example, chemical vapor deposition (CVD), sputtering, etc.

After metal level 202 is applied, a low-melting-point dielectric 203 is disposed on the wafer. The low-melting-point dielectric 203 may be a glass or organic material that will sag before it flows upon exposure to a heat cycle. Examples of satisfactory materials are polystyrene, which melts at about 240 degrees Celcius, polypropylene, which melts at about 190 degrees Celcius, and various chalcogenide glasses made of S, Se, Te, Sb, Ge, or As, which melt between about 300 and 500 degrees Celcius depending upon the composition. The manner of disposition of the material will typically be selected in response to the material and processing considerations. For the above materials, deposition may be performed by sputtering or spinning as is done for photoresist. The thickness of the deposition will be functionally related to the line pitch of the specific structure. For structures having a line pitch of approximately 1 micron, it is anticipated that dielectric layer 203 will be formed at a thickness of approximately 2 microns.

Following application of dielectric 203, photoresist 207 is disposed on its surface. Generally, any conventional photoresist will suffice, such as, for example, OCG 897I manufactured by Hunt Chemical Group.

After applying the photoresist, the wafer is subjected to masked light 206 which is light 205 as filtered through mask 204. This masking process will result in a pattern formation on the surface of photoresist 207. The undesirable portions of the photoresist 207, dielectric 203 and metal 202 may then be etched away. In one preferred embodiment each layer will be etched sequentially—photoresist 207, then dielectric 203, then metal 202. However, combinations of metal 202, dielectric 203 and photoresist may be selected in reference to etchouts to facilitate removal of two or more of the above layers in a single operation.

Referring now to FIG. 3, there is depicted an exemplary die structure 304, depicted in vertical cross section, of a wafer having structures formed and etched as described above. Structure 304 comprises first metal line 303, with low-melting-point dielectric 302 and photoresist 301 thereover. Structures 308 and 312, including metal lines 307 and 311, are constructed in a fashion identical to structure 304, ie. sections 305 and 309 are photoresist, and sections 306 and 310 are low-melting-point dielectric. Note also that metal lines 303 and 307 are relatively closely spaced yet separated by void 313.

In accord with the current method, photoresist sections 301, 305, 309 are removed by conventional processes, and the wafer is subjected to a heat cycle. Depending upon the nature of the dielectric sections 302, 306, an optimum temperature and time may be determined at which dielectric section 302 will sag and approach or meet sagging dielectric section 306 (but neither should flow). The resulting structure will resemble the cross sectional sample shown in FIG. 4. Due to the heat cycle, structures 304 and 308 are now capped by sagging dielectric sections 302 and 306 respectively. Furthermore, the sagging dielectric sections 302 and 306 have substantially encapsulated void 313. Moreover, even if there is not a perfect seal between sagging dielectric 302 and 306, a seal will be made when the metal level wafer is passivated (or insulated) with additional dielectric material. Some attention should be given to use a passivation material that will serve to seal any openings without flowing through into the void area. The final cross section is shown in FIG. 5 after passivation 501 has been applied.

In an alternative method of practicing the present invention, a sidewall film may be used to form a barrier that prevents dielectric from entering the void between closely spaced metal lines. Referring now to FIG. 6, area 601 schematically represents all layers of a processed silicon wafer disposed prior to metal level 602. Metal level 602 is again disposed on the wafer by any conventional technique. After metal 602 is deposed, an appropriate photoresist layer 603 is disposed on its surface.

After applying the photoresist, the wafer is subjected to masked light 606 which is light 605 as filtered through a mask 604. This masking process will again result in a pattern formation on the surface of photoresist 603. The undesirable portions of the photoresist 603 and metal 602 may then again be etched away.

One envisioned embodiment provides for both chemical and physical etchings of the wafer structure. Generally, most conventional chemical etching processes will result in a polymer film covering the wafer surface. The polymer film is generally the result of the unavoidable mix of etching chemicals with etched metal. The etching of polysilicon using echtants containing chlorine is known to produce a film of this type when the photoresist is present. Accordingly, absent a physical etch, the polymer film would cover both horizontally and vertically disposed surfaces of the wafer. The physical etch, however, generally comprises vertically directed ion bombardment. This vertical ion bombardment removes the polymer film from all horizontally disposed surfaces. Therefore, the only remaining polymer film exists on vertical surfaces—thus the name "sidewall film."

Figure 7:
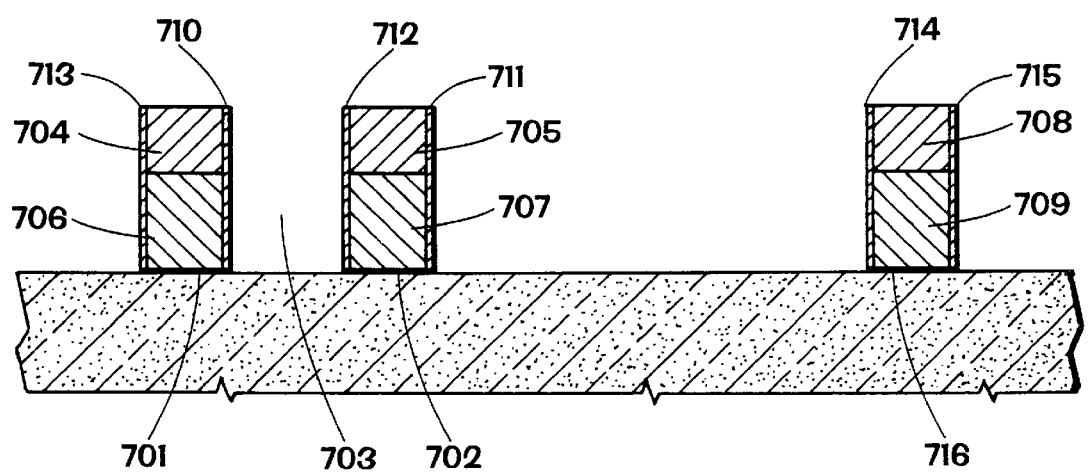
FIG. 7 illustrates three conductive lines bearing photoresist and sidewall film.

Referring now to FIG. 7, therein is depicted an exemplary die structure 701, illustrated in vertical cross section, for a wafer formed and etched as described relative to FIG. 6. Structure 701 comprises metal line 706, photoresist 704 and sidewall films 713 and 710. Structures 702 and 716 are constructed in a fashion identical to structure 701, ie. sections 708 and 705 are photoresist, sections 711, 712, 714 and 715 are sidewall films, and sections 707 and 709 are conductive (typically metal) lines. Again, metal lines 706 and 707 are relatively closely spaced yet separated by void 703.

According to one method, the wafer is subjected to a heat cycle prior to removal of photoresist sections 704, 705, 708. The photoresist sections 704, 705, 708, will be chosen such that a ratio of temperature and time may be determined by which photoresist 704 will sag and meet (or nearly meet) sagging photo resist 705, without flowing. Accordingly, the process is controllable to yield die structures as depicted in the cross section sample in FIG. 8.

Figure 8:
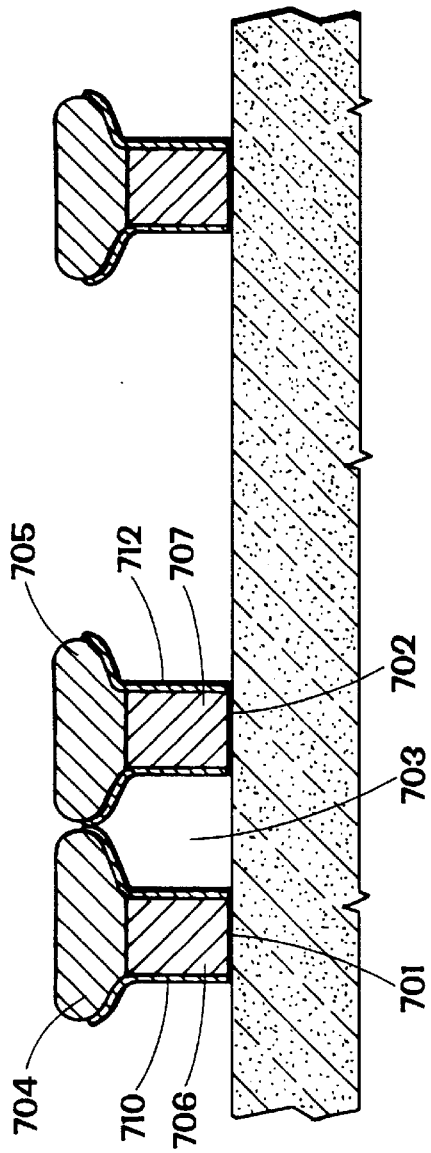
FIG. 8 illustrates three conductive lines bearing laterally expanded photoresist and sidewall film.

Referring now to FIG. 8, due to the heat cycle, structures 704 and 705 now comprise sagging photoresist sections 704 and 705 respectively. Furthermore, the sagging photoresist sections 704 and 705 have altered the shape of sidewall films 710 and 712 causing those films to substantially meet and encapsulate void 703. Thereafter, photoresist sections 704 and 705 are removed leaving sidewall films 710 and 712 to encapsulate the void 701. This etch is preferably performed with gentle dry process such as that available in a "down stream" dry resist removal operation. Of course, virtually any etching is appropriate which does not remove the polymer sidewall film 710 and 712.

Figure 9:
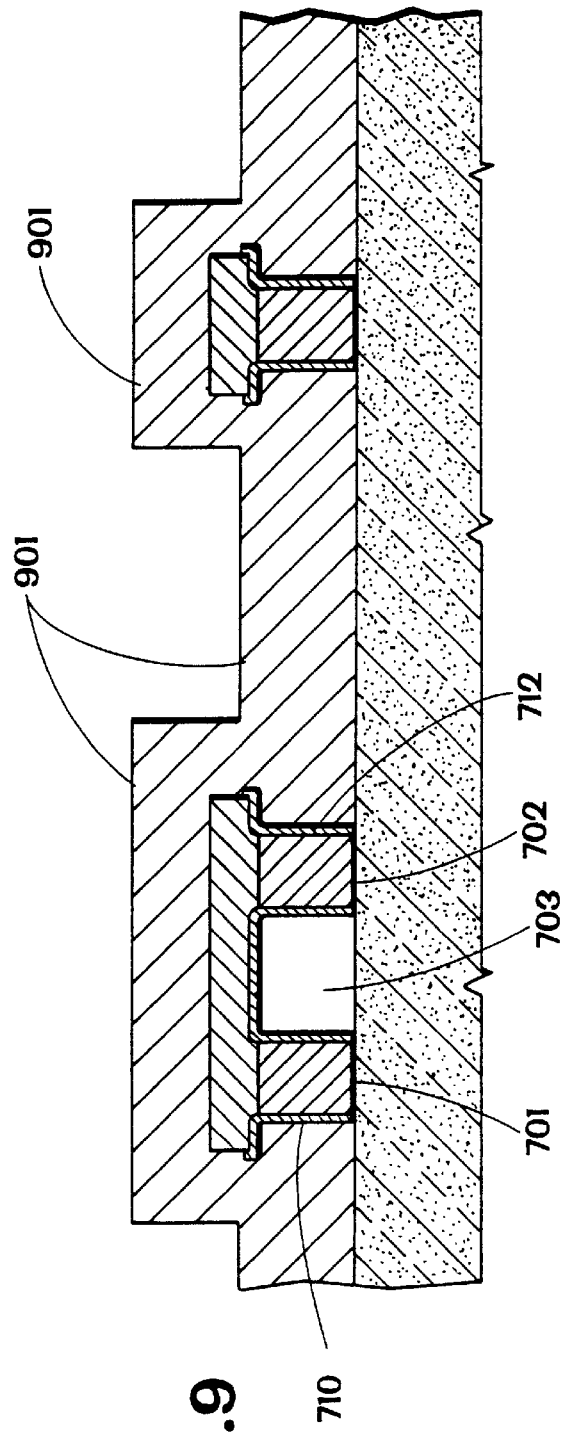
FIG. 9 illustrates a finished circuit having a void between closely spaced conductor lines.

Following removal of the photoresist 704, 705, the upper surface of the wafer is passivated or insulated with a dielectric material 901 as shown in FIG. 9. Therefore, even if there is not a perfect seal between sidewall films 710 and 712, a seal will be made when the metal level wafer is passivated (or insulated) with additional dielectric material 901. Some attention should be given to use a passivation material that will serve to seal any openings without flowing through into the void area 703.

What is claimed is:

1. An integrated circuit, comprising:
    a substrate;
    a first conductive line on said substrate;
    a second conductive line on said substrate, said second conductive line in spaced relation to said first conductive line; and a dielectric material having a melting point lower than 500 degrees Celsius and being disposed over said first and second conductive lines partially defining a cavity between said first and second conductive lines.

2. The circuit of claim 1 further comprising an insulation layer formed over said dielectric material.

3. The circuit of claim 1 wherein said dielectric material comprises glass.

4. The circuit of claim 1 wherein said dielectric material is organic.

5. The circuit of claim 1 wherein said conductive lines are metal.

6. A semiconductor die, comprising:

a substrate;

a first conductive line formed on said substrate;

a second conductive line formed on said substrate in spaced relation to said first conductive line to define a gap; and a dielectric film extending across said gap above said conductive lines to define a cavity between said lines, said dielectric film being one of polystyrene, polypropylene, and chalcogenide glass.

7. The die of claim 6 further comprising an insulating partially enclosed layer formed on top of said dielectric film.

8. A semiconductor device comprising:

a first conductive line having a first width;

a second conductive line having a second width and positioned generally adjacent to said first conductive line to define a gap therebetween;

a first distinct dielectric section deposited upon said first conductive line and having said first width, said first distinct dielectric section being expandable subsequent to deposition to a width greater than said first width;

a second distinct dielectric section deposited upon said second conductive line and having said second width, said second distinct dielectric section being expandable subsequent to deposition to a width greater than said second width to contact said first distinct dielectric section and define a cavity between said first and second conductive lines.

9. The circuit, as set forth in claim 1, wherein said dielectric material comprises polystyrene.

10. The circuit, as set forth in claim 1, wherein said dielectric material comprises polypropylene.

11. The circuit, as set forth in claim 1, wherein said dielectric material comprises chalcogenide glass.

12. The circuit, as set forth in claim 1, wherein said dielectric material has a melting point under 200 degrees Celsius.

13. The circuit, as set forth in claim 1, wherein said dielectric material has a melting point under 250 degrees Celsius.

14. An integrated circuit, comprising:

a substrate;

a first conductive line on said substrate;

a second conductive line on said substrate and in spaced relation to said first conductive line;

a first layer of dielectric material on said first conductive line; and a second layer of dielectric material on said second conductive line, wherein said first layer of dielectric material and said second layer of dielectric material move toward one another to define a void between said first conductive line and said second conductive line in response to heating said first and second layers of dielectric material.

15. The circuit, as set forth in claim 14, wherein said first and second layers of dielectric material comprise polystyrene.

16. The circuit, as set forth in claim 14, wherein said first and second layers of dielectric material comprise polypropylene.

17. The circuit, as set forth in claim 14, wherein said first and second layers of dielectric material comprise chalcogenide glass.

18. The circuit, as set forth in claim 14, wherein said first and second layers of dielectric material have a melting point under 200 degrees Celsius.

19. The circuit, as set forth in claim 14, wherein said first and second layers of dielectric material have a melting point under 250 degrees Celsius.

20. The circuit, as set forth in claim 14, wherein said first and second layers of dielectric material have a melting point under 500 degrees Celsius.

21. An integrated circuit, comprising:

a substrate;

a first conductive line on said substrate;

a second conductive line on said substrate and in spaced relation to said first conductive line;

a first layer of material being disposed on said first conductive line to form a first pillar;

a second layer of material being disposed on said second conductive line to form a second pillar, said first pillar having a sidewall facing said second pillar, and said second pillar having a sidewall facing said first pillar; and a dielectric film disposed on each of said sidewalls, wherein said first layer of material and said second layer of material move toward one another to join said dielectric film on each of said sidewalls to define a void between said first conductive line and said second conductive line in response to heating said first and second layers of material.

22. The circuit, as set forth in claim 21, wherein said first and second layers of material comprise photoresist.

23. The circuit, as set forth in claim 21, further comprising a layer of insulating material disposed over said joined dielectric films.

* * * * *